United States Patent
Komada

(10) Patent No.: US 8,697,466 B2
(45) Date of Patent: Apr. 15, 2014

(54) METHOD OF MANUFACTURING NITRIDE SEMICONDUCTOR DEVICE

(75) Inventor: Satoshi Komada, Osaka (JP)

(73) Assignee: Sharp Kabushiki Kaisha, Osaka-shi, Osaka (JP)

(*) Notice: Subject to any disclaimer, the term of this patent is extended or adjusted under 35 U.S.C. 154(b) by 70 days.

(21) Appl. No.: 13/614,589

(22) Filed: Sep. 13, 2012

(65) Prior Publication Data

US 2013/0089973 A1 Apr. 11, 2013

(30) Foreign Application Priority Data

Oct. 7, 2011 (JP) .................................. 2011-222880

(51) Int. Cl.
*H01L 33/24* (2010.01)

(52) U.S. Cl.
USPC .......... 438/44; 438/47; 438/481; 257/E21.125

(58) Field of Classification Search
USPC .................. 438/44, 47, 481, 978, FOR. 249; 257/E21.125
See application file for complete search history.

(56) References Cited

U.S. PATENT DOCUMENTS

| | | | |
|---|---|---|---|
| 6,325,850 B1* | 12/2001 | Beaumont et al. | 117/95 |
| 8,354,289 B2* | 1/2013 | Kim et al. | 438/42 |
| 8,445,930 B2* | 5/2013 | Komada | 257/98 |
| 2006/0033119 A1* | 2/2006 | Shibata | 257/103 |
| 2006/0266281 A1* | 11/2006 | Beaumont et al. | 117/84 |
| 2007/0057276 A1* | 3/2007 | Kiyoku et al. | 257/103 |
| 2007/0072320 A1* | 3/2007 | Frayssinet et al. | 438/22 |
| 2008/0014723 A1* | 1/2008 | Shibata | 438/478 |
| 2008/0048195 A1* | 2/2008 | Okuyama et al. | 257/94 |
| 2009/0098343 A1* | 4/2009 | Arena et al. | 428/172 |
| 2011/0049544 A1 | 3/2011 | Komada | |
| 2011/0068347 A1* | 3/2011 | Strittmatter | 257/76 |
| 2012/0057163 A1* | 3/2012 | Cheng et al. | 356/445 |
| 2012/0091467 A1* | 4/2012 | Chakraborty et al. | 257/76 |
| 2013/0015426 A1* | 1/2013 | Waag et al. | 257/13 |
| 2013/0175501 A1* | 7/2013 | Hersee et al. | 257/22 |
| 2013/0178050 A1* | 7/2013 | Kim et al. | 438/494 |

FOREIGN PATENT DOCUMENTS

| | | |
|---|---|---|
| JP | 2002-43233 | 2/2002 |
| JP | 2011-77499 | 4/2011 |

* cited by examiner

*Primary Examiner* — George Fourson, III
(74) *Attorney, Agent, or Firm* — Morrison & Foerster LLP

(57) ABSTRACT

A method of manufacturing a nitride semiconductor device includes the step of forming a second nitride semiconductor layer having an inclined facet by metal-organic chemical vapor deposition, in which a molar flow ratio of a group V element gas to a group III element gas that are supplied to a growth chamber of a metal-organic chemical vapor deposition growth apparatus is set at 240 or less.

7 Claims, 10 Drawing Sheets

METHOD OF MANUFACTURING NITRIDE SEMICONDUCTOR DEVICE

This nonprovisional application is based on Japanese Patent Application No. 2011-222880 filed on Oct. 7, 2011, with the Japan Patent Office, the entire contents of which are hereby incorporated by reference.

BACKGROUND OF THE INVENTION

1. Field of the Invention

The present invention relates to methods of manufacturing a nitride semiconductor device.

2. Description of the Background Art

Nitride semiconductor devices such as a nitride semiconductor light-emitting diode device, a nitride semiconductor laser device and a nitride semiconductor transistor device are manufactured using a substrate such as a gallium nitride substrate, a silicon carbide substrate or a sapphire substrate. Among these substrates, a sapphire substrate having advantages in cost, mass production and the like has been widely used.

Unfortunately, due to a high lattice mismatch ratio between a sapphire substrate and a nitride semiconductor layer such as gallium nitride formed on the substrate, many threading dislocations occur in the nitride semiconductor layer. The threading dislocations cause deterioration in various characteristics such as reduced luminous efficacy of a nitride semiconductor light-emitting diode device, reduced life of a nitride semiconductor laser device, and reduced electron mobility in a nitride semiconductor transistor device.

To address this issue, Patent Literature 1 (Japanese Patent Laying-Open No. 2002-43233), for example, discloses a method of reducing the dislocation density in a GaN layer arranged on a top surface by interposing a SiN layer between GaN layers.

SUMMARY OF THE INVENTION

If a SiN layer is partially formed on a GaN layer to manufacture a nitride semiconductor device, the GaN layer will not be grown in areas where the SiN layer is present. Thus, dislocations are terminated in the portions where the SiN layer has been formed.

However, the dislocations pass through areas where the SiN layer is not present. Thus, when the dislocations are propagated upward, an effective reduction in dislocation density in the GaN layer cannot be expected.

Furthermore, if a SiN layer is formed in a large area when a GaN layer has inclined facets, it is difficult to bury the GaN layer, resulting in deterioration in surface morphology of the GaN layer.

In view of the circumstances described above, an object of the present invention is to provide a method of manufacturing a nitride semiconductor device, which is capable of reducing the dislocation density in a nitride semiconductor layer even if a silicon nitride layer is formed, and attaining an excellent surface morphology of the nitride semiconductor layer.

The present invention is a method of manufacturing a nitride semiconductor device, including the steps of forming a first nitride semiconductor layer by metal-organic chemical vapor deposition, forming a silicon nitride layer on the first nitride semiconductor layer, forming a second nitride semiconductor layer having an inclined facet by metal-organic chemical vapor deposition to cover the first nitride semiconductor layer and the silicon nitride layer, and forming a third nitride semiconductor layer having a flat upper surface by metal-organic chemical vapor deposition to bury the inclined facet of the second nitride semiconductor layer. In the step of forming a second nitride semiconductor layer by metal-organic chemical vapor deposition, a molar flow ratio of a group V element gas to a group III element gas that are supplied to a growth chamber of a metal-organic chemical vapor deposition growth apparatus is set at 240 or less.

Preferably, in the method of manufacturing a nitride semiconductor device of the present invention, a sapphire substrate is provided, the method further includes the step of forming a buffer layer on a surface of the substrate before the step of forming a first nitride semiconductor layer by metal-organic chemical vapor deposition, and the step of forming a first nitride semiconductor layer by metal-organic chemical vapor deposition includes the step of forming the first nitride semiconductor layer on the buffer layer.

Preferably, in the method of manufacturing a nitride semiconductor device of the present invention, the buffer layer is aluminum nitride.

Preferably, in the method of manufacturing a nitride semiconductor device of the present invention, the surface of the substrate has concave and convex portions.

Preferably, in the method of manufacturing a nitride semiconductor device of the present invention, the first nitride semiconductor layer includes an inclined facet layer and a flat layer.

Preferably, in the method of manufacturing a nitride semiconductor device of the present invention, the inclined facet of the second nitride semiconductor layer is inclined at an angle of 45° or more relative to a growth surface of the second nitride semiconductor layer.

Preferably, in the method of manufacturing a nitride semiconductor device of the present invention, the second nitride semiconductor layer has a thickness of 2 μm or more.

According to the present invention, a method of manufacturing a nitride semiconductor device can be provided, which is capable of reducing the dislocation density in a nitride semiconductor layer even if a silicon nitride layer is formed, and attaining an excellent surface morphology of the nitride semiconductor layer.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
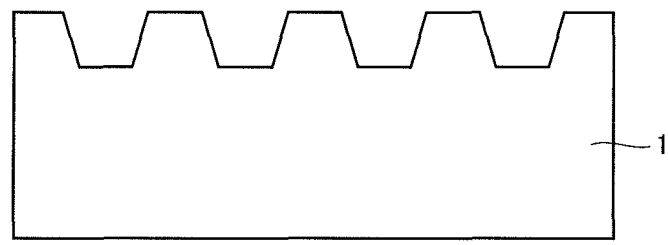
FIG. 1 is a schematic cross-sectional view illustrating a step of a method of manufacturing a nitride semiconductor light-emitting diode device in a first embodiment.

Embodiments of the present invention will be described below. It is noted that the same or corresponding parts are denoted with the same reference characters in the drawings of the present invention.

<First Embodiment>

First, as shown in a schematic cross-sectional view of FIG. 1, a step of preparing a substrate 1 having concave and convex portions on its surface is performed. The step of preparing substrate 1 having concave and convex portions on its surface can be implemented, for example, by patterning a resist on the surface of substrate 1 which may be a sapphire substrate, a silicon carbide substrate, a gallium nitride substrate or a zinc oxide substrate, and etching a part of the surface of substrate 1 using ICP (Inductively Coupled Plasma) or the like.

Figure 2:
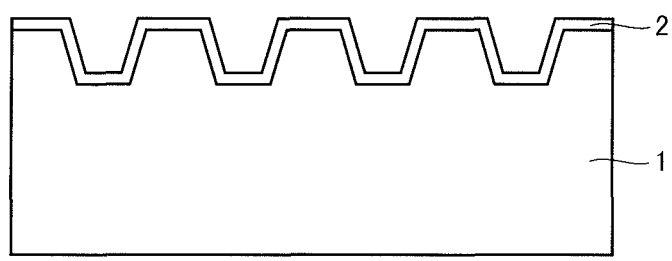
FIG. 2 is a schematic cross-sectional view illustrating another step of the method of manufacturing the nitride semiconductor light-emitting diode device in the first embodiment.

Next, as shown in a schematic cross-sectional view of FIG. 2, a step of forming a buffer layer 2 on the surface of substrate 1 is performed. The step of forming buffer layer 2 can be implemented, for example, by laminating a nitride semiconductor layer made of a nitride semiconductor represented by an expression of $Al_{x1}Ga_{1-x1}N$ ($0 \leq x1 \leq 1$) on the surface of substrate 1 by sputtering. Preferably, an aluminum nitride layer is formed as buffer layer 2. If an aluminum nitride layer is formed as buffer layer 2, the dislocation density in a nitride semiconductor layer to be formed on buffer layer 2 tends to be able to be reduced.

Figure 3:
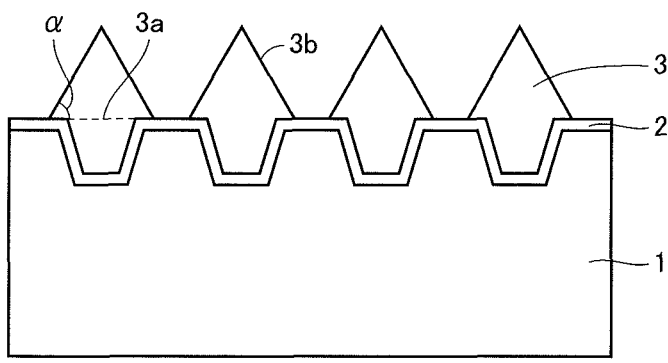
FIG. 3 is a schematic cross-sectional view illustrating another step of the method of manufacturing the nitride semiconductor light-emitting diode device in the first embodiment.

Next, a step of forming a first nitride semiconductor layer on the surface of substrate 1 by metal-organic chemical vapor deposition (MOCVD) is performed. The step of forming the first nitride semiconductor layer by MOCVD can be implemented as follows, for example. First, as shown in a schematic cross-sectional view of FIG. 3, a step of forming inclined facet layers 3 having inclined facets 3b on a surface of buffer layer 2 by MOCVD is performed.

The step of forming inclined facet layers 3 by MOCVD can be implemented, for example, by laminating a nitride semiconductor layer made of a nitride semiconductor represented by an expression of $Al_{x2}Ga_{y2}In_{z2}N$ ($0 \leq x2 \leq 1$, $0 \leq y2 \leq 1$, $0 \leq z2 \leq 1$, $x2+y2+z2 \neq 0$) on the surface of buffer layer 2 by MOCVD.

Preferably, inclined facet 3b of each inclined facet layer 3 is inclined at an angle α of 45° or more relative to a growth surface 3a of each inclined facet layer 3. In this case, dislocations that have occurred on substrate 1 at an early stage of growth can be effectively curved in a lateral direction, thereby reducing the dislocation density in a nitride semiconductor layer to be formed on inclined facet layers 3.

Figure 4:
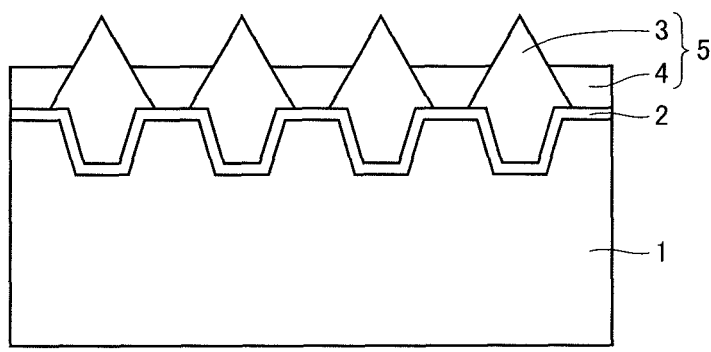
FIG. 4 is a schematic cross-sectional view illustrating another step of the method of manufacturing the nitride semiconductor light-emitting diode device in the first embodiment.

Next, as shown in a schematic cross-sectional view of FIG. 4, a step of forming a burying layer 4 as a flat layer by MOCVD to bury the surface of buffer layer 2 exposed between inclined facets 3b of inclined facet layers 3 is performed.

The step of forming burying layer 4 by MOCVD can be implemented, for example, by laminating a nitride semiconductor layer made of a nitride semiconductor represented by an expression of $Al_{x3}Ga_{y3}In_{z3}N$ ($0 \leq x3 \leq 1$, $0 \leq y3 \leq 1$, $0 \leq z3 \leq 1$, $x3+y3+z3 \neq 0$) on the surface of buffer layer 2 exposed between inclined facets 3b of inclined facet layers 3 by MOCVD. Preferably, as shown in FIG. 4, for example, burying layer 4 buries the space between inclined facets 3b halfway along inclined facet layers 3 in a thickness direction thereof, rather than burying the entire inclined facet layers 3.

By performing these steps, a first nitride semiconductor layer 5 formed of inclined facet layers 3 and burying layer 4 can be formed on the surface of substrate 1 by MOCVD.

Figure 5:
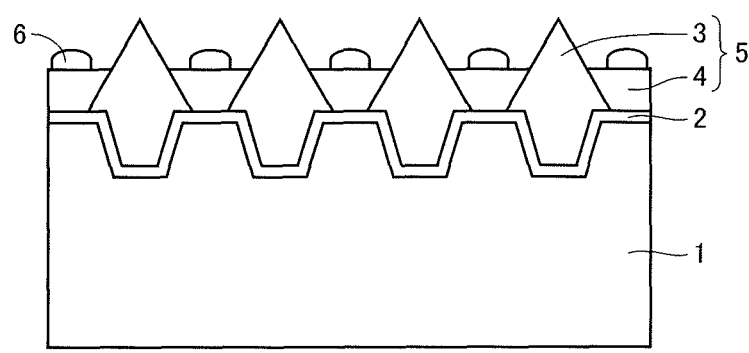
FIG. 5 is a schematic cross-sectional view illustrating another step of the method of manufacturing the nitride semiconductor light-emitting diode device in the first embodiment.

Next, as shown in a schematic cross-sectional view of FIG. 5, a step of forming silicon nitride layers 6 on a surface of first nitride semiconductor layer 5 is performed.

The step of forming silicon nitride layers 6 can be implemented, for example, by forming silicon nitride layers 6 on a surface of burying layer 4 of first nitride semiconductor layer 5 by CVD.

Figure 6:
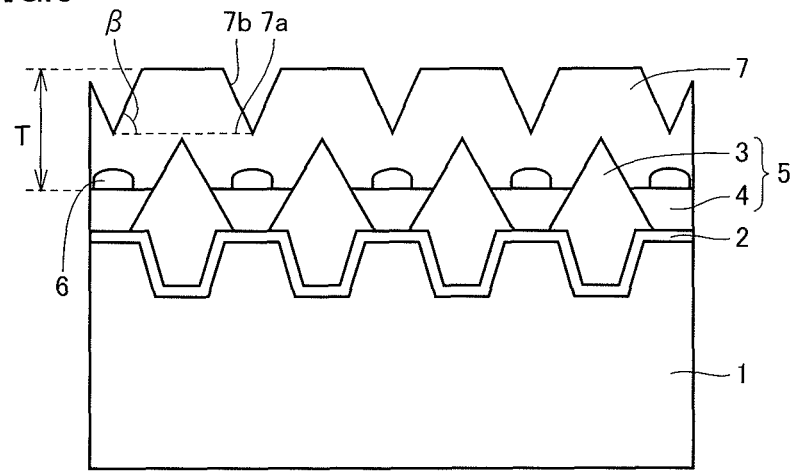
FIG. 6 is a schematic cross-sectional view illustrating another step of the method of manufacturing the nitride semiconductor light-emitting diode device in the first embodiment.

Next, as shown in a schematic cross-sectional view of FIG. 6, a step of forming a second nitride semiconductor layer 7 having inclined facets 7b by MOCVD to cover first nitride semiconductor layer 5 and silicon nitride layers 6 is performed.

The step of forming second nitride semiconductor layer 7 by MOCVD can be implemented, for example, by laminating a nitride semiconductor layer made of a nitride semiconductor represented by an expression of $Al_{x4}Ga_{y4}In_{z4}N$ ($0 \leq x4 \leq 1$, $0 \leq y4 \leq 1$, $0 \leq z4 \leq 1$, $x4+y4+z4 \neq 0$) by MOCVD to cover first nitride semiconductor layer 5 and silicon nitride layers 6.

Preferably, each inclined facet 7b of second nitride semiconductor layer 7 is inclined at an angle β of 45° or more relative to a growth surface 7a of second nitride semiconductor layer 7. In this case, dislocations that have been propagated in a thickness direction of first nitride semiconductor layer 5 can be curved in a lateral direction by inclined facets 7b of second nitride semiconductor layer 7, thereby effectively preventing the propagation of dislocations. Thus, the dislocation density in an upper surface of a nitride semiconductor layer to be formed on second nitride semiconductor layer 7 tends to be able to be significantly reduced.

Preferably, second nitride semiconductor layer 7 has a thickness T of 2 μm or more. If second nitride semiconductor layer 7 has thickness T of 2 μm or more, the dislocation density in the surface of the nitride semiconductor layer to be formed on second nitride semiconductor layer 7 tends to be able to be significantly reduced.

Figure 7:
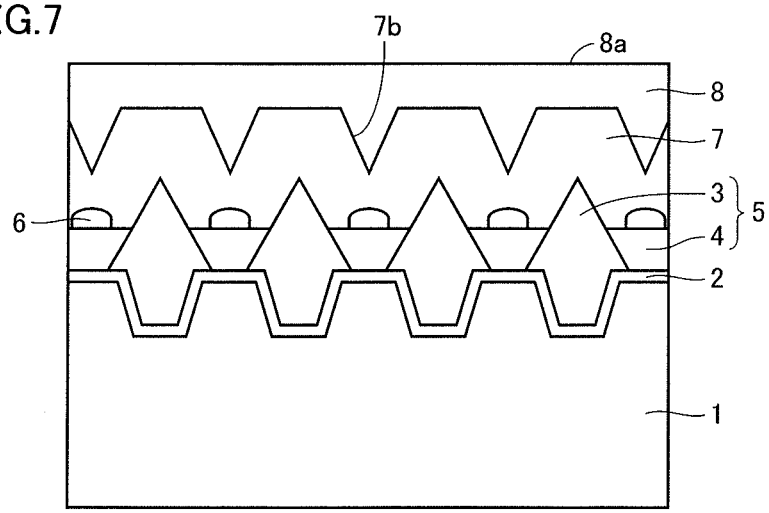
FIG. 7 is a schematic cross-sectional view illustrating another step of the method of manufacturing the nitride semiconductor light-emitting diode device in the first embodiment.

Next, as shown in a schematic cross-sectional view of FIG. 7, a step of forming a third nitride semiconductor layer 8 having a flat upper surface 8a by MOCVD to bury inclined facets 7b of second nitride semiconductor layer 7 is performed.

The step of forming third nitride semiconductor layer 8 by MOCVD can be implemented, for example, by laminating a nitride semiconductor layer made of a nitride semiconductor represented by an expression of $Al_{x5}Ga_{y5}In_{z5}N$ ($0 \leq x5 \leq 1$, $0 \leq y5 \leq 1$, $0 \leq z5 \leq 1$, $x5+y5+z5 \neq 0$) by MOCVD to bury the space between inclined facets 7b of second nitride semiconductor layer 7.

In this embodiment, in the step of forming second nitride semiconductor layer 7 by MOCVD, a molar flow ratio of a group III element gas to a group V element gas that are supplied to a growth chamber of an MOCVD growth apparatus ((a molar flow rate of the group V element gas supplied to the growth chamber of the MOCVD growth apparatus)/(a molar flow rate of the group III element gas supplied to the growth chamber of the MOCVD growth apparatus)) is set at 240 or less. This is based on findings as a result of diligent studies by the present inventors that, by setting the molar flow ratio of the group V element gas to the group III element gas that are supplied to the growth chamber of the MOCVD growth apparatus at 240 or less when forming second nitride semiconductor layer 7 by MOCVD, the dislocation density in upper surface 8a of third nitride semiconductor layer 8 formed on second nitride semiconductor layer 7 having inclined facets 7b can be reduced even if silicon nitride layers 6 are formed, and an excellent surface morphology of upper surface 8a of third nitride semiconductor layer 8 can be attained.

Preferably, in the step of forming second nitride semiconductor layer 7 by MOCVD, the molar flow ratio of the group V element gas to the group III element gas that are supplied to the growth chamber of the MOCVD growth apparatus is set at 120 or less. In this case, the dislocation density in upper surface 8a of third nitride semiconductor layer 8 tends to be able to be further reduced.

Preferably, in the step of forming second nitride semiconductor layer 7 by MOCVD, the molar flow ratio of the group V element gas to the group III element gas that are supplied to the growth chamber of the MOCVD growth apparatus is set at 90 or more. In this case, the dislocation density in upper surface 8a of third nitride semiconductor layer 8 tends to be able to be further reduced.

Figure 8:
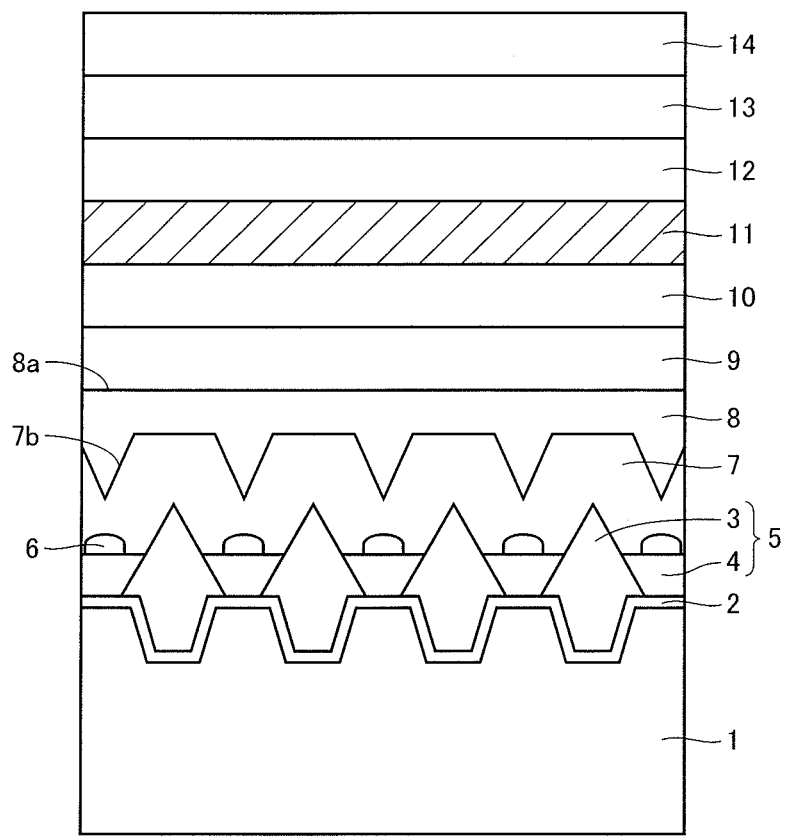
FIG. 8 is a schematic cross-sectional view illustrating another step of the method of manufacturing the nitride semiconductor light-emitting diode device in the first embodiment.

Next, as shown in a schematic cross-sectional view of FIG. 8, an n type nitride semiconductor layer 9, a nitride semiconductor superlattice structure layer 10, a nitride semiconductor active layer 11, a first p type nitride semiconductor layer 12 and a second p type nitride semiconductor layer 13 are successively laminated on upper surface 8a of third nitride semiconductor layer 8 by MOCVD, and then a translucent electrode layer 14 is laminated on a surface of second p type nitride semiconductor layer 13 by EB (Electron Beam) deposition or the like, to form a laminated body.

N type nitride semiconductor layer 9 can be formed, for example, by laminating a nitride semiconductor layer which is made of a nitride semiconductor represented by an expression of $Al_{x6}Ga_{y6}In_{z6}N$ ($0 \leq x6 \leq 1$, $0 \leq y6 \leq 1$, $0 \leq z6 \leq 1$, $x6+y6+z6 \neq 0$), and is doped with an n type dopant.

Nitride semiconductor superlattice structure layer 10 can be formed, for example, by laminating one nitride semiconductor layer made of a nitride semiconductor represented by an expression of $Al_{x7}Ga_{y7}In_{z7}N$ ($0 \leq x7 \leq 1$, $0 \leq y7 \leq 1$, $0 \leq z7 \leq 1$, $x7+y7+z7 \neq 0$) and one nitride semiconductor layer made of a nitride semiconductor represented by an expression of $Al_{x8}Ga_{y8}In_{z8}N$ ($0 \leq x8 \leq 1$, $0 \leq y8 \leq 1$, $0 \leq z8 \leq 1$, $x8+y8+z8 \neq 0$), which are different in composition from each other.

Nitride semiconductor active layer 11 can be formed, for example, by laminating one nitride semiconductor well layer made of a nitride semiconductor represented by an expression of $Al_{x9}Ga_{y9}In_{z9}N$ ($0 \leq x9 \leq 1$, $0 \leq y9 \leq 1$, $0 \leq z9 \leq 1$, $x9+y9+z9 \neq 0$) and one nitride semiconductor barrier layer made of a nitride semiconductor represented by an expression of $Al_{x10}Ga_{y10}In_{z10}N$ ($0 \leq x10 \leq 1$, $0 \leq y10 \leq 1$, $0 \leq z10 \leq 1$, $x10+y10+z10 \neq 0$) having a band gap wider than that of the nitride semiconductor well layer, which are different in composition from each other. Nitride semiconductor active layer 11 may include, without being limited, six nitride semiconductor well layers, for example.

First p type nitride semiconductor layer 12 can be formed, for example, by laminating a nitride semiconductor layer which is made of a nitride semiconductor represented by an expression of $Al_{x11}Ga_{y11}In_{z11}N$ ($0 \leq x11 \leq 1$, $0 \leq y11 \leq 1$, $0 \leq z11 \leq 1$, $x11+y11+z11 \neq 0$), and is doped with a p type dopant.

Second p type nitride semiconductor layer 13 can be formed, for example, by laminating a nitride semiconductor layer which is made of a nitride semiconductor represented by an expression of $Al_{x12}Ga_{y12}In_{z12}N$ ($0 \leq x12 \leq 1$, $0 \leq y12 \leq 1$, $0 \leq z12 \leq 1$, $x12+y12+z12 \neq 0$), and is doped with a p type dopant.

Translucent electrode layer 14 can be formed by laminating a layer made of ITO (Indium Tin Oxide), for example.

Figure 9:
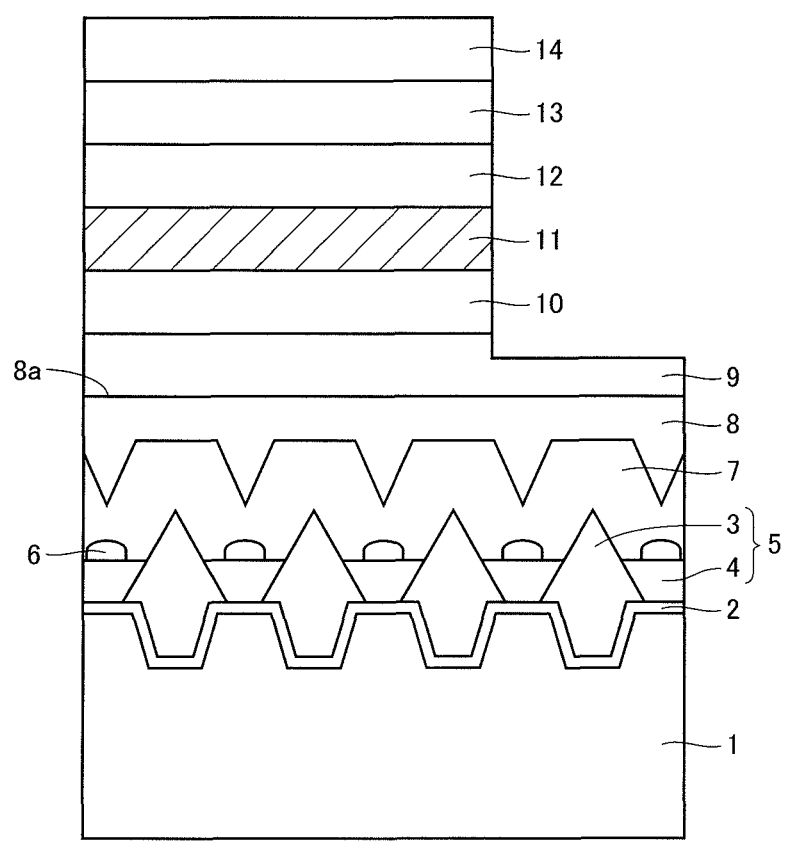
FIG. 9 is a schematic cross-sectional view illustrating another step of the method of manufacturing the nitride semiconductor light-emitting diode device in the first embodiment.

Next, as shown in a schematic cross-sectional view of FIG. 9, a part of the laminated body shown in FIG. 8 is removed by etching or the like, to expose a part of a surface of n type nitride semiconductor layer 9.

Figure 10:
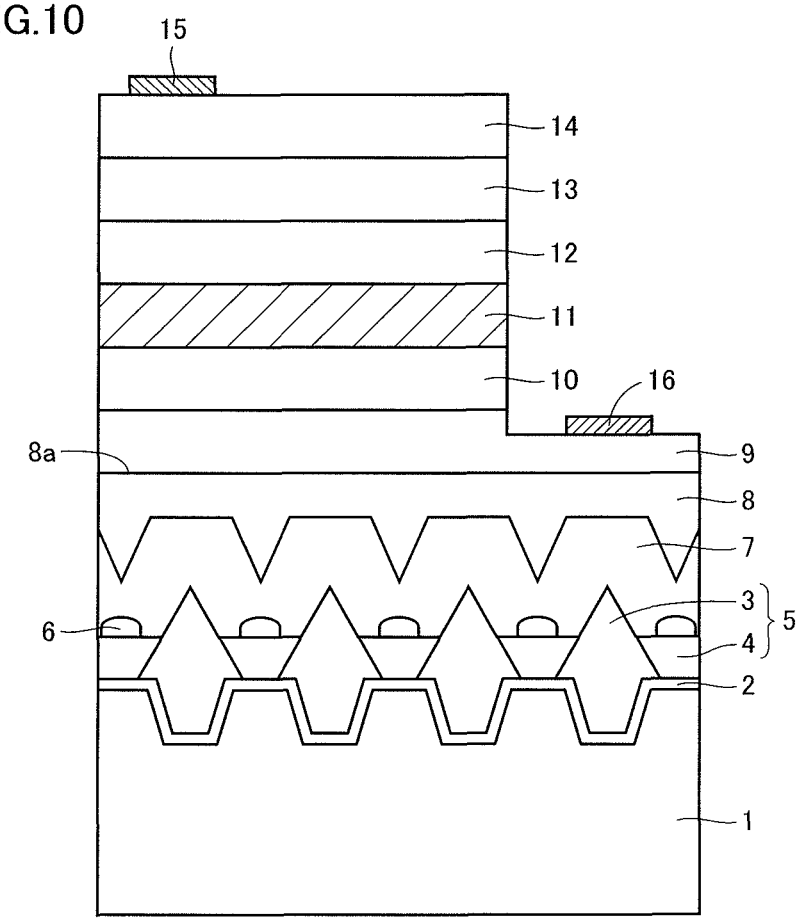
FIG. 10 is a schematic cross-sectional view illustrating another step of the method of manufacturing the nitride semiconductor light-emitting diode device in the first embodiment.

Next, as shown in a schematic cross-sectional view of FIG. 10, an n side electrode 16 is formed on the exposed surface of n type nitride semiconductor layer 9, and a p side electrode 15 is formed on a surface of translucent electrode layer 14, to fabricate a nitride semiconductor light-emitting diode device in the first embodiment.

In the nitride semiconductor light-emitting diode device thus fabricated in the first embodiment, the molar flow ratio of the group V element gas to the group III element gas that are supplied to the growth chamber of the MOCVD growth apparatus is set at 240 or less when forming second nitride semiconductor layer 7 by MOCVD, as described above. Thus, the dislocation density in upper surface 8a of third nitride semiconductor layer 8 can be reduced, and an excellent surface morphology of upper surface 8a of third nitride semiconductor layer 8 can be attained.

In the nitride semiconductor light-emitting diode device in the first embodiment, therefore, above upper surface 8a of third nitride semiconductor layer 8 having such low dislocation density and excellent surface morphology, the dislocation density can be reduced to improve crystallinity in each of n type nitride semiconductor layer 9, nitride semiconductor superlattice structure layer 10, nitride semiconductor active layer 11, first p type nitride semiconductor layer 12 and second p type nitride semiconductor layer 13, thereby improving characteristics such as luminous efficacy.

[Second Embodiment]

A second embodiment is characterized in that a nitride semiconductor laser device is fabricated rather than a nitride semiconductor light-emitting diode device.

An example of a method of manufacturing the nitride semiconductor laser device in the second embodiment will be described below. First, in a manner similar to the first embodiment, buffer layer 2, inclined facet layers 3, first burying layer 4, silicon nitride layers 6, second nitride semiconductor layer 7 and third nitride semiconductor layer 8 are successively laminated on the surface of substrate 1.

Figure 11:
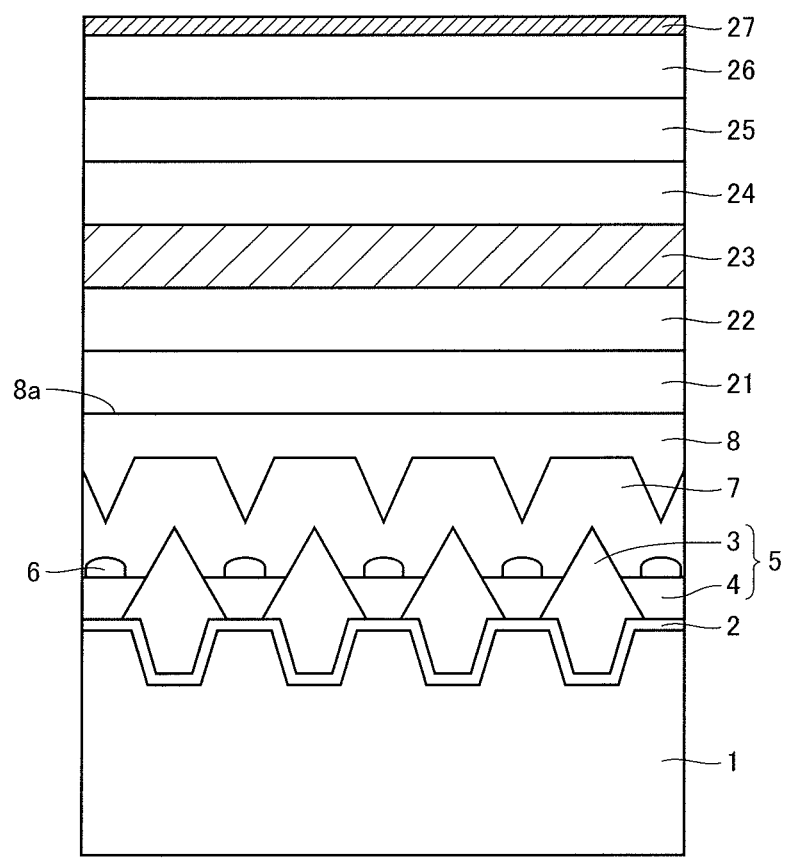
FIG. 11 is a schematic cross-sectional view illustrating a step of an example of a method of manufacturing a nitride semiconductor laser device in a second embodiment.

Next, as shown in a schematic cross-sectional view of FIG. 11, an n type nitride semiconductor cladding layer 21, an n type nitride semiconductor light guide layer 22, a nitride semiconductor active layer 23, a nitride semiconductor protection layer 24, a p type nitride semiconductor light guide layer 25, a p type nitride semiconductor cladding layer 26 and a p type nitride semiconductor contact layer 27 are successively laminated on upper surface 8a of third nitride semiconductor layer 8 by MOCVD, to form a laminated body.

N type nitride semiconductor cladding layer 21 can be formed, for example, by laminating a nitride semiconductor layer which is made of a nitride semiconductor represented by an expression of $Al_{x13}Ga_{y13}In_{z13}N$ ($0 \leq x13 \leq 1$, $0 \leq y13 \leq 1$, $0 \leq z13 \leq 1$, $x13+y13+z13 \neq 0$), and is doped with an n type dopant.

N type nitride semiconductor light guide layer 22 can be formed, for example, by laminating a nitride semiconductor layer which is made of a nitride semiconductor represented by an expression of $Al_{x14}Ga_{y14}In_{z14}N$ ($0 \leq x14 \leq 1$, $0 \leq y14 \leq 1$, $0 \leq z14 \leq 1$, $x14+y14+z14 \neq 0$), and is doped with an n type dopant.

Nitride semiconductor active layer 23 can be formed, for example, by laminating one nitride semiconductor layer made of a nitride semiconductor represented by an expression of $Al_{x15}Ga_{y15}In_{z15}N$ ($0 \leq x15 \leq 1$, $0 \leq y15 \leq 1$, $0 \leq z15 \leq 1$, $x15+y15+z15 \neq 0$) and one nitride semiconductor layer made of a nitride semiconductor represented by an expression of $Al_{x16}Ga_{y16}In_{z16}N$ ($0 \leq x16 \leq 1$, $0 \leq y16 \leq 1$, $0 \leq z16 \leq 1$, $x16+y16+z16 \neq 0$), which are different in composition from each other.

Nitride semiconductor protection layer 24 can be formed, for example, by laminating a nitride semiconductor layer made of a nitride semiconductor represented by an expression of $Al_{x17}Ga_{y17}In_{z17}N$ ($0 \leq x17 \leq 1$, $0 \leq y17 \leq 1$, $0 \leq z17 \leq 1$, $x17+y17+z17 \neq 0$).

P type nitride semiconductor light guide layer 25 can be formed, for example, by laminating a nitride semiconductor layer which is made of a nitride semiconductor represented by an expression of $Al_{x18}Ga_{y18}In_{z18}N$ ($0 \leq x18 \leq 1$, $0 \leq y18 \leq 1$, $0 \leq z18 \leq 1$, $x18+y18+z18 \neq 0$), and is doped with a p type dopant.

P type nitride semiconductor cladding layer 26 can be formed, for example, by laminating a nitride semiconductor layer which is made of a nitride semiconductor represented by an expression of $Al_{x19}Ga_{y19}In_{z19}N$ ($0 \leq x19 \leq 1$, $0 \leq y19 \leq 1$, $0 \leq z19 \leq 1$, $x19+y19+z19 \neq 0$), and is doped with a p type dopant.

P type nitride semiconductor contact layer 27 can be formed, for example, by laminating a nitride semiconductor layer which is made of a nitride semiconductor represented by an expression of $Al_{x20}Ga_{y20}In_{z20}N$ ($0 \leq x20 \leq 1$, $0 \leq y20 \leq 1$, $0 \leq z20 \leq 1$, $x20+y20+z20 \neq 0$), and is doped with a p type dopant.

Figure 12:
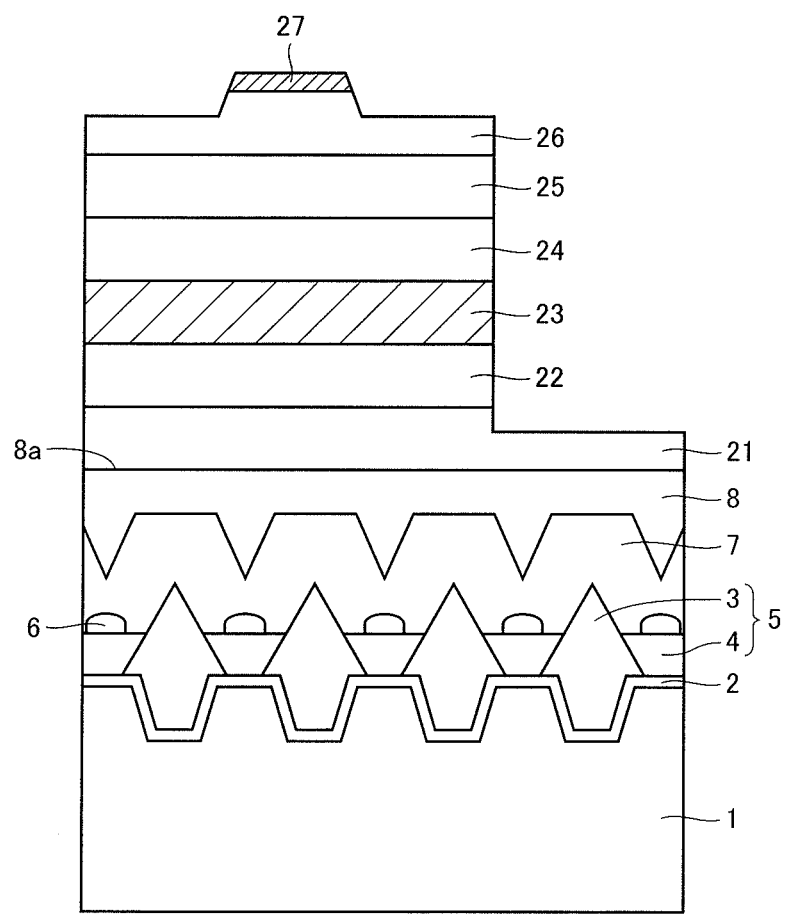
FIG. 12 is a schematic cross-sectional view illustrating another step of the example of the method of manufacturing the nitride semiconductor laser device in the second embodiment.

Next, as shown in a schematic cross-sectional view of FIG. 12, a part of each of p type nitride semiconductor cladding layer 26 and p type nitride semiconductor contact layer 27 of the laminated body shown in FIG. 11 is removed by etching or the like, to expose a part of a surface of p type nitride semiconductor cladding layer 26. In addition, a part of the laminated body shown in FIG. 11 is removed by etching or the like, to expose a part of a surface of n type nitride semiconductor cladding layer 21.

Figure 13:
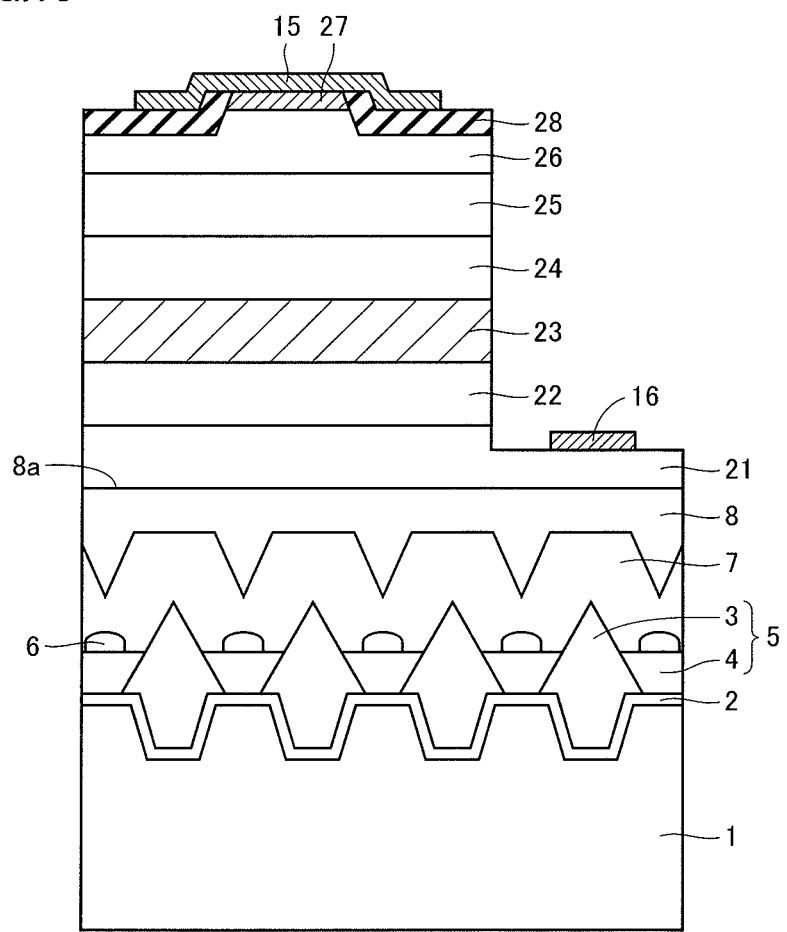
FIG. 13 is a schematic cross-sectional view illustrating another step of the example of the method of manufacturing the nitride semiconductor laser device in the second embodiment.

Next, as shown in a schematic cross-sectional view of FIG. 13, an insulating film 28 made of silicon oxide, for example, is formed to expose a surface of p type nitride semiconductor contact layer 27 and to cover the exposed surface of p type nitride semiconductor cladding layer 26. Then, n side electrode 16 is formed on the exposed surface of n type nitride semiconductor cladding layer 21, and p side electrode 15 in contact with p type nitride semiconductor contact layer 27 is formed on insulating film 28, to fabricate the nitride semiconductor laser device in the second embodiment.

Again in the nitride semiconductor laser device thus fabricated in the second embodiment, the molar flow ratio of the group V element gas to the group III element gas that are supplied to the growth chamber of the MOCVD growth apparatus is set at 240 or less when forming second nitride semiconductor layer 7 by MOCVD, as described above. Thus, the dislocation density in upper surface 8a of third nitride semiconductor layer 8 can be reduced, and an excellent surface morphology of upper surface 8a of third nitride semiconductor layer 8 can be attained.

Again in the nitride semiconductor laser device in the second embodiment, therefore, above upper surface 8a of third nitride semiconductor layer 8 having such low dislocation density and excellent surface morphology, the dislocation density can be reduced to improve crystallinity in each of n type nitride semiconductor cladding layer 21, n type nitride semiconductor light guide layer 22, nitride semiconductor active layer 23, nitride semiconductor protection layer 24, p type nitride semiconductor light guide layer 25, p type nitride semiconductor cladding layer 26 and p type nitride semiconductor contact layer 27, thereby improving characteristics such as lasing oscillation.

The second embodiment is similar to the first embodiment except for the descriptions above, and therefore descriptions thereof will not be repeated.

[Third Embodiment]

A third embodiment is characterized in that a nitride semiconductor transistor device which is an example of electronic devices is fabricated, rather than light-emitting devices such as a nitride semiconductor light-emitting diode device and a nitride semiconductor laser device.

An example of a method of manufacturing the nitride semiconductor transistor device in the third embodiment will be described below. First, in a manner similar to the first and second embodiments, buffer layer 2, inclined facet layers 3, first burying layer 4, silicon nitride layers 6, second nitride semiconductor layer 7 and third nitride semiconductor layer 8 are successively laminated on the surface of substrate 1.

Figure 14:
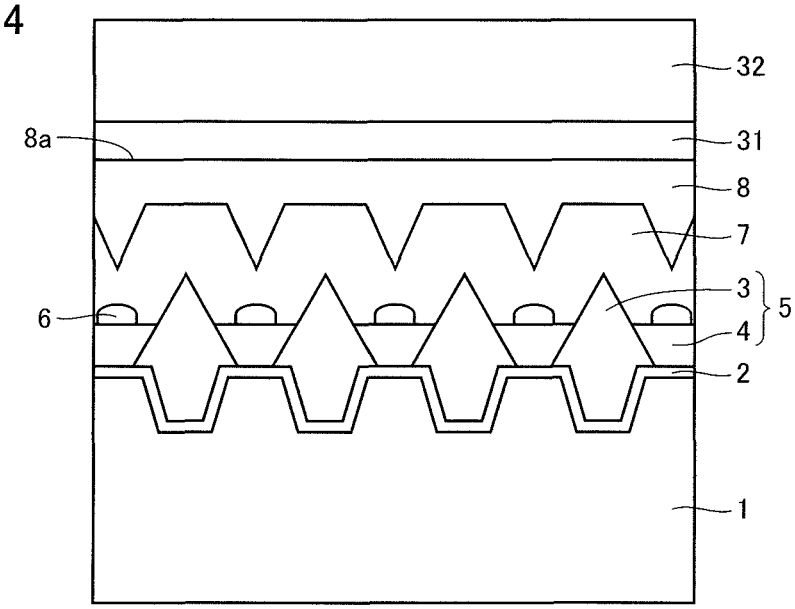
FIG. 14 is a schematic cross-sectional view illustrating a step of an example of a method of manufacturing a nitride semiconductor transistor device in a third embodiment.

Next, as shown in a schematic cross-sectional view of FIG. 14, MOCVD is used to laminate a nitride semiconductor electron transit layer 31 made of undoped GaN or the like on upper surface 8a of third nitride semiconductor layer 8, and to laminate an n type nitride semiconductor electron supply layer 32 made of n type AlGaN or the like on a surface of nitride semiconductor electron transit layer 31.

Figure 15:
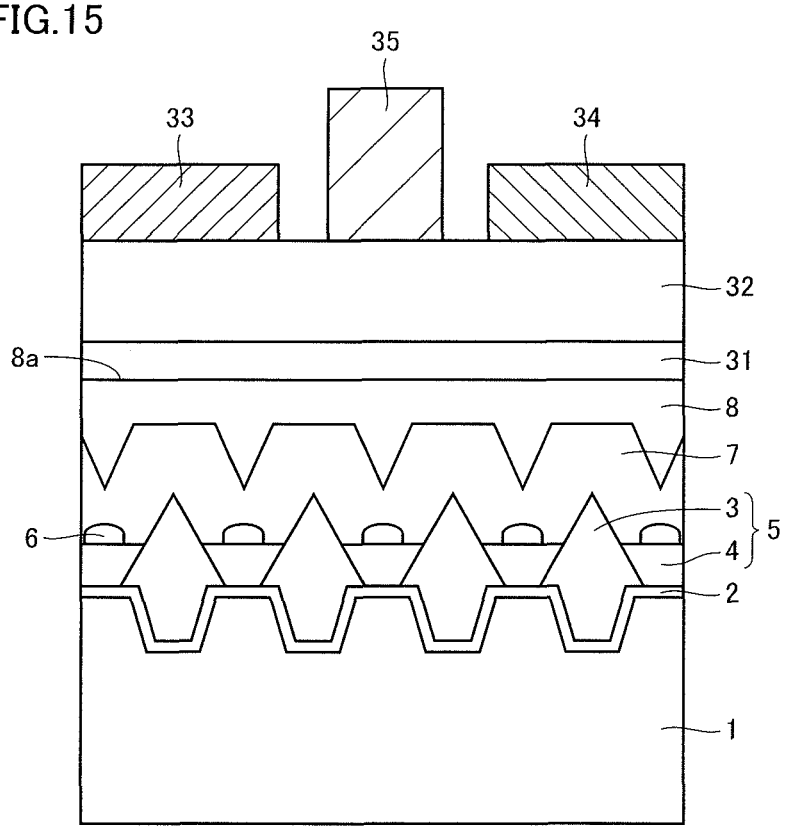
FIG. 15 is a schematic cross-sectional view illustrating another step of the example of the method of manufacturing the nitride semiconductor transistor device in the third embodiment.

Next, as shown in a schematic cross-sectional view of FIG. 15, a source electrode 33, a drain electrode 34 and a gate electrode 35 are formed on a surface of n type nitride semiconductor electron supply layer 32, to fabricate the nitride semiconductor transistor device in the third embodiment.

Again in the nitride semiconductor transistor device thus fabricated in the third embodiment, the molar flow ratio of the group V element gas to the group III element gas that are supplied to the growth chamber of the MOCVD growth apparatus is set at 240 or less when forming second nitride semiconductor layer 7 by MOCVD, as described above. Thus, the dislocation density in upper surface 8a of third nitride semiconductor layer 8 can be reduced, and an excellent surface morphology of upper surface 8a of third nitride semiconductor layer 8 can be attained.

Again in the nitride semiconductor transistor device in the third embodiment, therefore, above upper surface 8a of third nitride semiconductor layer 8 having such low dislocation density and excellent surface morphology, the dislocation density can be reduced to improve crystallinity in each of nitride semiconductor electron transit layer 31 and n type nitride semiconductor electron supply layer 32, thereby improving characteristics such as electron mobility.

The third embodiment is similar to the first and second embodiments except for the descriptions above, and therefore descriptions thereof will not be repeated.

EXAMPLES

Example 1

Figure 16:
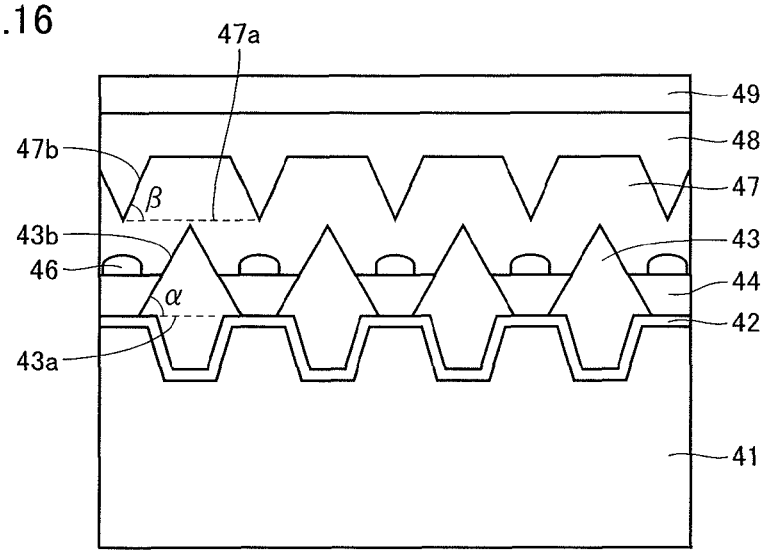
FIG. 16 is a schematic cross-sectional view of a test sample in examples.

A test sample shown in a schematic cross-sectional view of FIG. 16 was fabricated as described below, and the dislocation density and surface morphology of a surface of a conductive layer 49 made of n type GaN were evaluated.

Specifically, first, a resist was patterned on a sapphire substrate 41 using a stepper, and a surface of sapphire substrate 41 was etched using ICP (Inductively Coupled Plasma), to form concave and convex portions on the surface of sapphire substrate 41.

Next, sapphire substrate 41 having the concave and convex portions was placed in a film formation chamber of a sputtering film formation apparatus, and nitrogen gas was flown into the film formation chamber of the sputtering film formation apparatus, to nitride the surface of sapphire substrate 41. Then, the temperature of sapphire substrate 41 was set at 50° C., the pressure in the film formation chamber of the sputtering film formation apparatus was held at 0.5 Pa, nitrogen gas was flown into the film formation chamber of the sputtering film formation apparatus at a flow rate of 5 sccm, and a high-frequency bias was applied to a metal Al target, to form an AlN buffer layer 42 having a thickness of 25 nm.

Next, sapphire substrate 41 having AlN buffer layer 42 formed thereon was cooled, and placed in a growth chamber of an MOCVD apparatus. After that, the temperature of sapphire substrate 41 was set at 90° C., and NH₃ (ammonia) gas as a group V source and TMG (trimethylgallium) gas as a group III source were supplied into the growth chamber of the MOCVD apparatus, to grow inclined facet layers 43 made of GaN having inclined facets 43b having a height of 1.7 µm. Inclined facet 43b of each inclined facet layer 43 had an angle α of about 60° relative to a growth surface 43a of each inclined facet layer 43. Inclined facet layers 43 were only grown on the upper surfaces of concave portions of the concave and convex portions on the surface of sapphire substrate 41.

Next, under similar conditions to those for inclined facet layers 43 except that the temperature of sapphire substrate 41 was set at 1200° C., recesses between inclined facets 43b of inclined facet layers 43 were filled with a first burying layer 44 made of GaN. First burying layer 44 had a thickness of 0.5 µm, and buried the recesses to a height halfway along inclined facets 43b of inclined facet layers 43.

Next, the temperature of sapphire substrate 41 was set at 1255° C., and SiH₄ (silane) gas as a group IV source and NH₃ gas as a group V source were supplied for 19.5 minutes, respectively, to grow a silicon nitride layer 46 on a surface of first burying layer 44. TMG was not supplied when growing silicon nitride layer 46.

Next, the supply of SiH₄ gas was stopped, and TMG gas and NH₃ gas were supplied so that a molar flow ratio of the NH₃ gas to the TMG gas was set at 120, while the temperature of sapphire substrate 41 was maintained at 1255° C., to form a facet control layer 47 which is made of GaN, has a thickness of 3 µm, and has inclined facets 47b. Each inclined facet 47b had an angle β of 45° or more relative to a growth surface 47a of facet control layer 47.

Next, TMG gas and NH₃ gas were supplied so that a molar flow ratio of the NH₃ gas to the TMG gas was set at 440, while the temperature of sapphire substrate 41 was maintained at 1255° C., to grow a second burying layer 48 made of GaN having a thickness of 2 µm.

Next, in order to measure the dislocation density by CL (cathodeluminescence), the TMG gas and NH₃ gas were supplied in similar amounts to those when growing second burying layer 48, and SiH₄ gas was further supplied at a concentration of $5\times10^{18}/cm^3$, to grow conductive layer 49 made of GaN having a thickness of 0.5 µm.

It is noted that the temperature of sapphire substrate 41 described above refers to the temperature of a thermocouple in contact with a carbon susceptor.

The dislocation density in a surface of conductive layer 49 of the test sample thus fabricated in Example 1 was measured by CL. The results are shown in Table 1. As shown in Table 1, the surface of conductive layer 49 of the test sample in Example 1 had a dislocation density of $5.4\times10^7/cm^2$.

In addition, the surface of conductive layer 49 of the test sample in Example 1 was examined. The results are shown in Table 1. As shown in Table 1, no whitening indicative of surface roughness was observed on the surface of conductive layer 49 of the test sample in Example 1, and it was confirmed that the surface had an excellent surface morphology.

Figure 17:
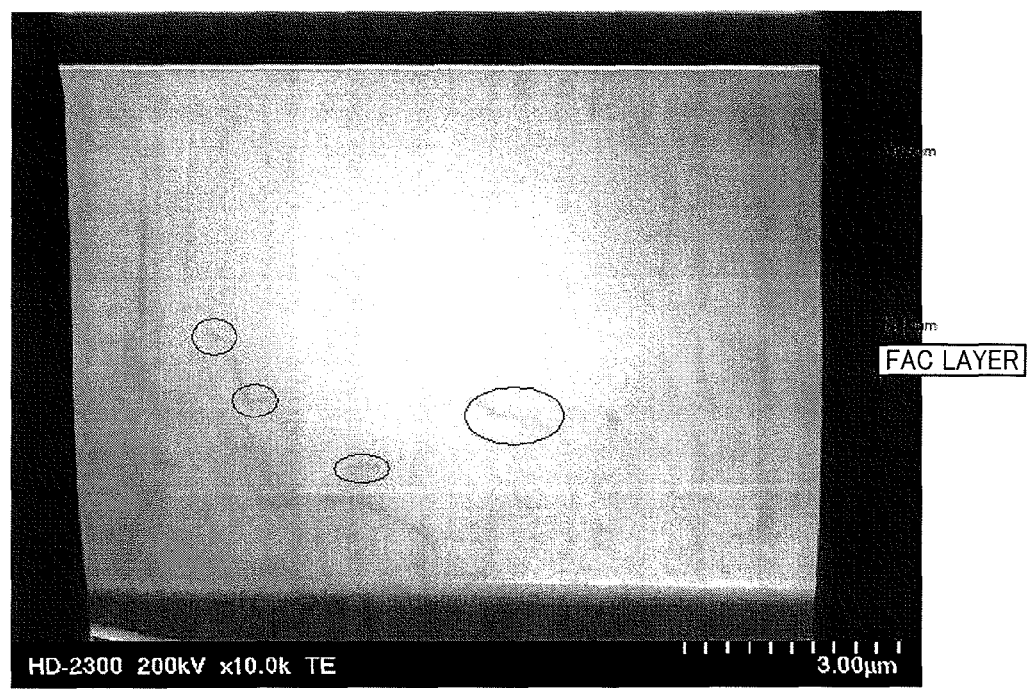
FIG. 17 shows a STEM image of the test example in Example 1.

FIG. 17 shows a STEM (Scanning Transmission Electron Microscope) image of the test example in Example 1. The portion of an FAC layer shown at the right of FIG. 17 corresponds to facet control layer 47, and it was observed that dislocations extended in a lateral direction in portions encircled with solid lines. It was thus confirmed that the dislocations that had been propagated from below facet control layer 47 could be effectively curved in a lateral direction by inclined facets 47b of facet control layer 47.

Example 2

In a manner similar to Example 1 except that the molar flow ratio of the NH₃ gas to the TMG gas was set at 240 when forming facet control layer 47, a test sample in Example 2 was fabricated, and the dislocation density and surface morphology of the surface of conductive layer 49 made of n type GaN were evaluated. The results are shown in Table 1.

As shown in Table 1, the surface of conductive layer 49 of the test sample in Example 2 had a dislocation density of $1\times10^8/cm^2$. No whitening indicative of surface roughness was observed on the surface of conductive layer 49 of the test sample in Example 2, either, and it was confirmed that the surface had an excellent surface morphology.

Example 3

In a manner similar to Example 1 except that the temperature of sapphire substrate 41 was set at 1205° C. and the molar flow ratio of the NH₃ gas to the TMG gas was set at 90 when forming facet control layer 47, a test sample in Example 3 was fabricated, and the dislocation density and surface morphology of the surface of conductive layer 49 made of n type GaN were evaluated. The results are shown in Table 1.

As shown in Table 1, the surface of conductive layer 49 of the test sample in Example 3 had a dislocation density of $3.5 \times 10^7/\text{cm}^2$. No whitening indicative of surface roughness was observed on the surface of conductive layer 49 of the test sample in Example 3, either, and it was confirmed that the surface had an excellent surface morphology.

Example 4

In a manner similar to Example 1 except that the temperature of sapphire substrate 41 was set at 1205° C. and the molar flow ratio of the NH₃ gas to the TMG gas was set at 120 when forming facet control layer 47, a test sample in Example 4 was fabricated, and the dislocation density and surface morphology of the surface of conductive layer 49 made of n type GaN were evaluated. The results are shown in Table 1.

As shown in Table 1, the surface of conductive layer 49 of the test sample in Example 4 had a dislocation density of $4.8 \times 10^7/\text{cm}^2$. No whitening indicative of surface roughness was observed on the surface of conductive layer 49 of the test sample in Example 4, either, and it was confirmed that the surface had an excellent surface morphology.

Example 5

In a manner similar to Example 1 except that facet control layer 47 was formed to a thickness of 2 μm, a test sample in Example 5 was fabricated, and the dislocation density and surface morphology of the surface of conductive layer 49 made of n type GaN were evaluated. The results are shown in Table 1.

As shown in Table 1, the surface of conductive layer 49 of the test sample in Example 5 had a dislocation density of $6.8 \times 10^7/\text{cm}^2$. No whitening indicative of surface roughness was observed on the surface of conductive layer 49 of the test sample in Example 5, either, and it was confirmed that the surface had an excellent surface morphology.

when forming facet control layer 47, than in Example 2 where the molar flow ratio was set at 240.

Moreover, as shown in the row of Example 3 in Table 1, it was confirmed that the dislocation density in the surface of conductive layer 49 could be further reduced by lowering the temperature of sapphire substrate 41 to 1205° C. and setting the molar flow ratio of the NH₃ gas to the TMG gas at 90 when forming facet control layer 47.

Furthermore, as shown in the row of Example 4 in Table 1, the dislocation density in the surface of conductive layer 49 was higher in Example 4 where the molar flow ratio was set at 120 when the temperature of sapphire substrate 41 was set at 1205° C. when forming facet control layer 47, than in Example 3. The dislocation density reducing effect in the surface of conductive layer 49 by reducing the molar flow ratio of the NH₃ gas to the TMG gas was confirmed also by the comparison between Example 3 and Example 4.

The reason why the dislocation density in the surface of conductive layer 49 decreased by reducing the molar flow ratio of the NH₃ gas to the TMG gas in this manner may be because the nuclear density increased and the frequency of association between the dislocations decreased, so that the dislocation density could be reduced more effectively.

In addition, since each inclined facet 47b had an angle of 45° or more relative to growth surface 47a of facet control layer 47, the dislocations that had been propagated to facet control layer 47 were curved at a larger angle, so that the dislocations could be curved more effectively in a lateral direction.

Furthermore, since the dislocation density in the surface of conductive layer 49 was higher in Example 5 where facet control layer 47 had a thickness of 2 μm than in Example 1 where facet control layer 47 had a thickness of 3 μm as shown in Table 1, it was confirmed that a preferable thickness of facet control layer 47 was 2 μm or more.

The present invention can be utilized in a method of manufacturing a nitride semiconductor device, and can be suitably utilized particularly to manufacture nitride semiconductor devices such as a nitride semiconductor light-emitting diode device (LED), a nitride semiconductor laser device (LD) and a nitride semiconductor transistor device.

TABLE 1

| | Growth Conditions for Facet Control Layer | | | | Evaluation | |
|---|---|---|---|---|---|---|
| | | Molar Ratio of | | | | |
| | Substrate | Group V Element | Facet Control Layer | | Dislocation | |
| | Temperature (° C.) | Gas to Group III Element Gas | Thickness (μm) | Angle β | Density (/cm²) | Surface Morphology |
| Example 1 | 1255 | 120 | 3 | 45° or more | $5.4 \times 10^7$ | Excellent |
| Example 2 | 1255 | 240 | 3 | 45° or more | $1 \times 10^8$ | Excellent |
| Example 3 | 1205 | 90 | 3 | 45° or more | $3.5 \times 10^7$ | Excellent |
| Example 4 | 1205 | 120 | 3 | 45° or more | $4.8 \times 10^7$ | Excellent |
| Example 5 | 1255 | 120 | 2 | 45° or more | $6.8 \times 10^7$ | Excellent |

As shown in Table 1, the dislocation density in the surface of conductive layer 49 was lower in Example 1 where the molar flow ratio of the NH₃ gas to the TMG gas was set at 120

Although the present invention has been described and illustrated in detail, it is clearly understood that the same is by way of illustration and example only and is not to be taken by way of limitation, the scope of the present invention being interpreted by the terms of the appended claims.

What is claimed is:

1. A method of manufacturing a nitride semiconductor device, comprising the steps of:
   forming a first nitride semiconductor layer by metal-organic chemical vapor deposition;
   forming a silicon nitride layer on said first nitride semiconductor layer;
   forming a second nitride semiconductor layer having an inclined facet by metal-organic chemical vapor deposition to cover said first nitride semiconductor layer and said silicon nitride layer; and
   forming a third nitride semiconductor layer having a flat upper surface by metal-organic chemical vapor deposition to bury said inclined facet of said second nitride semiconductor layer,
   in said step of forming a second nitride semiconductor layer by metal-organic chemical vapor deposition, a molar flow ratio of a group V element gas to a group III element gas that are supplied to a growth chamber of a metal-organic chemical vapor deposition growth apparatus being set at 240 or less.

2. The method of manufacturing a nitride semiconductor device according to claim 1, wherein
   a sapphire substrate is provided,
   said method further comprises the step of forming a buffer layer on a surface of said substrate before said step of forming a first nitride semiconductor layer by metal-organic chemical vapor deposition, and
   said step of forming a first nitride semiconductor layer by metal-organic chemical vapor deposition includes the step of forming said first nitride semiconductor layer on said buffer layer.

3. The method of manufacturing a nitride semiconductor device according to claim 2, wherein
   said buffer layer is aluminum nitride.

4. The method of manufacturing a nitride semiconductor device according to claim 2, wherein
   said surface of said substrate has concave and convex portions.

5. The method of manufacturing a nitride semiconductor device according to claim 1, wherein
   said first nitride semiconductor layer includes an inclined facet layer and a flat layer.

6. The method of manufacturing a nitride semiconductor device according to claim 1, wherein
   said inclined facet of said second nitride semiconductor layer is inclined at an angle of 45° or more relative to a growth surface of said second nitride semiconductor layer.

7. The method of manufacturing a nitride semiconductor device according to claim 1, wherein
   said second nitride semiconductor layer has a thickness of 2 μm or more.

* * * * *